United States Patent
Landgraf

(10) Patent No.: US 9,564,449 B2
(45) Date of Patent: Feb. 7, 2017

(54) SEMICONDUCTOR DEVICE AND METHOD OF FORMING A SEMICONDUCTOR DEVICE

(71) Applicant: Infineon Technologies AG, Neubiberg (DE)

(72) Inventor: Bernd Landgraf, St. Martin (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 14/222,843

(22) Filed: Mar. 24, 2014

(65) Prior Publication Data

US 2015/0270276 A1    Sep. 24, 2015

(51) Int. Cl.
| | |
|---|---|
| H01L 21/02 | (2006.01) |
| H01L 27/115 | (2006.01) |
| H01L 29/66 | (2006.01) |
| H01L 29/788 | (2006.01) |
| H01L 21/28 | (2006.01) |
| H01L 29/94 | (2006.01) |
| H01L 49/02 | (2006.01) |

(52) U.S. Cl.
CPC ... *H01L 27/11524* (2013.01); *H01L 21/28273* (2013.01); *H01L 28/60* (2013.01); *H01L 29/66181* (2013.01); *H01L 29/66825* (2013.01); *H01L 29/788* (2013.01); *H01L 29/7883* (2013.01); *H01L 29/94* (2013.01)

(58) Field of Classification Search
CPC .............. H01L 27/115; H01L 27/11524; H01L 29/66825; H01L 29/788; H01L 21/28273; H01L 29/94; H01L 29/7883; H01L 29/66181; H01L 28/60
USPC .................................................. 257/607, 316
See application file for complete search history.

(56) References Cited

U.S. PATENT DOCUMENTS

| | | | | |
|---|---|---|---|---|
| 5,661,056 A | * | 8/1997 | Takeuchi | H01L 21/28202 257/E21.68 |
| 6,153,463 A | * | 11/2000 | Wei | H01L 29/94 257/295 |
| 6,876,582 B2 | | 4/2005 | Wang et al. | |
| 2005/0250278 A1 | * | 11/2005 | Randolph | H01L 27/115 438/210 |
| 2006/0226489 A1 | * | 10/2006 | Wang | G11C 16/045 257/365 |
| 2008/0308855 A1 | | 12/2008 | El-Kareh et al. | |
| 2013/0015517 A1 | * | 1/2013 | Widjaja | G11C 11/404 257/316 |
| 2014/0015029 A1 | * | 1/2014 | Hsu | H01L 21/28273 257/316 |

* cited by examiner

*Primary Examiner* — Tuan Nguyen
(74) *Attorney, Agent, or Firm* — Viering, Jentschura & Partner mbB

(57) ABSTRACT

A semiconductor device is provided, which may include: a well of a first conductivity type located within a substrate of a second conductivity type; a well terminal electrically coupled to the well; a floating gate disposed over the well; a floating gate terminal electrically coupled to the floating gate; a control gate disposed over the floating gate and electrically coupled to the well; and a control gate terminal electrically coupled to the control gate; wherein the floating gate terminal is configured to receive a first voltage; wherein the control gate terminal and the well terminal are configured to receive a second voltage.

10 Claims, 3 Drawing Sheets

SEMICONDUCTOR DEVICE AND METHOD OF FORMING A SEMICONDUCTOR DEVICE

TECHNICAL FIELD

Various embodiments relate generally to a semiconductor device and to a method of forming a semiconductor device.

BACKGROUND

Many integrated circuits may require capacitors for storing electric charge. The capacitors may for example be used for bridging gaps in supply with electricity, e.g. in a case of wireless devices, a lack of an electric field. An increasing number of applications may require storing electric charge, and the amount of charges to be stored may be increasing.

SUMMARY

A semiconductor device is provided, which may include: a well of a first conductivity type located within a substrate of a second conductivity type; a well terminal electrically coupled to the well; a floating gate disposed over the well; a floating gate terminal electrically coupled to the floating gate; a control gate disposed over the floating gate and electrically coupled to the well; and a control gate terminal electrically coupled to the control gate; wherein the floating gate terminal is configured to receive a first voltage; wherein the control gate terminal and the well terminal are configured to receive a second voltage.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

"Length", as used herein, may refer to a dimension of a structure, a layer etc. extending parallel to a surface of a substrate. "Width", as used herein, may refer to a dimension of the structure, the layer etc. extending parallel to the surface of the substrate and orthogonal to the length. "Thickness", as used herein, may refer to a dimension of the structure, the layer etc. extending orthogonal to the surface of the substrate, i.e. orthogonal to the width and orthogonal to the length.

Figure 1:
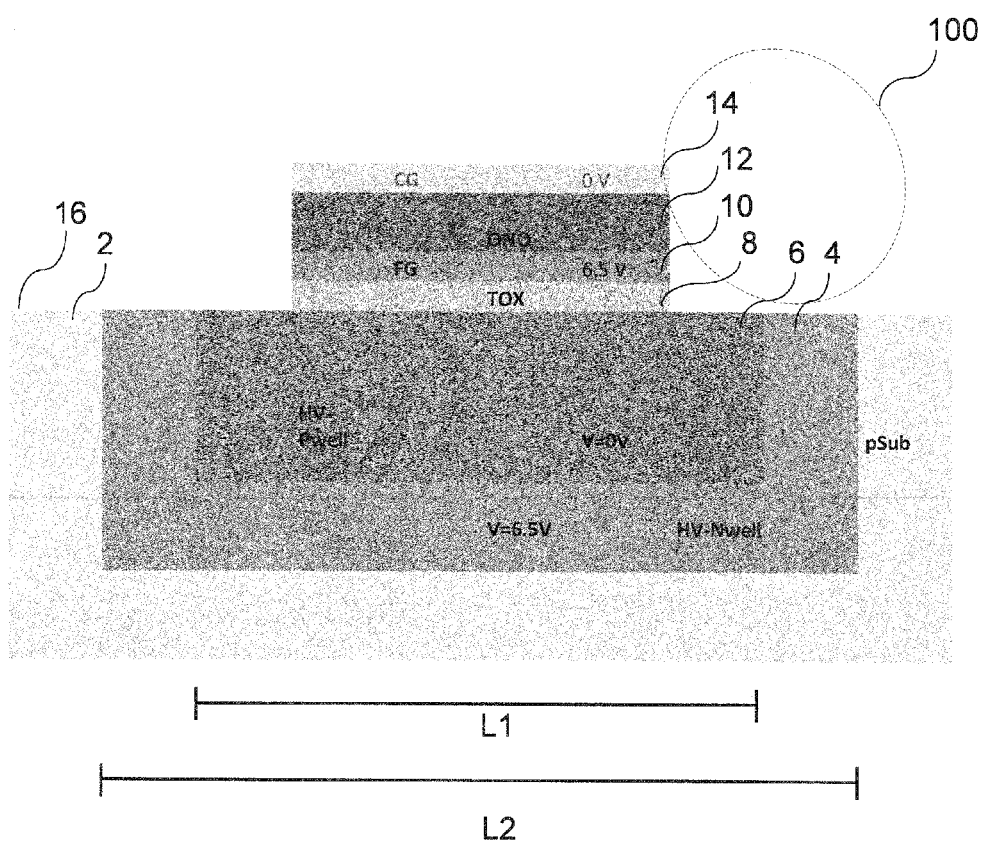
FIG. 1 shows a schematic cross section of a semiconductor device with a triple well design.

A semiconductor device 100, as shown in FIG. 1, may have a so-called triple well design, wherein a tunnel oxide NMOS-transistor 6, 8, 10, 12, 14 (which includes a P-well 6, also referred to as the inner well 6) may be arranged in an N-well 4, for example in a high voltage (HV) N-well 4, also referred to as the outer well 4. However, the triple well design, as compared with a single well design, may require additional space, for example in lateral dimensions, i.e. an area of a primary surface 16 of a substrate 2 covered by the semiconductor device 100. On the other hand, biased diodes formed in the wells 4, 6 may contribute only marginally to a total capacity of a capacitor formed by the semiconductor device 100. This may for example be relevant for large area capacitors.

Furthermore, a P-well 6, for example an HV-P-well 6 of the NMOS transistor 6, 8, 10, 12, 14, may have a high electrical resistivity, which may be relevant for an RC time constant of the capacitor. A dynamic behavior of the capacitor with the NMOS transistor 6, 8, 10, 12, 14 may be limited.

In various embodiments, a semiconductor device may require or occupy a smaller area of a substrate. The semiconductor device, for example a capacitor, may be configured to store more electric charge per area, i.e. a capacity density of the semiconductor device may be increased.

In various embodiments, a dynamic behavior of the semiconductor device may be improved. A processing of signals at a higher speed, i.e. at a higher frequency, may be possible.

In various embodiments, the tunnel oxide NMOS transistor may be replaced by a tunnel oxide PMOS transistor. In this way, the triple well design may become obsolete. Only the tunnel oxide PMOS transistor (including an N-well), arranged in a p-doped substrate, may be required.

The area required by the semiconductor device in accordance with various embodiments may be decreased with respect to the semiconductor device 100 with the triple well design by the additional area that the (outer) N-well 4 of the triple well design occupies. In other words, whereas the semiconductor device 100 with the triple well design may occupy an area of the substrate 2 determined by a length L2 extending parallel to a surface 16 of a substrate 2 (see FIG. 1, where L2 is shown to extend in left-right-direction) and an orthogonal width W2 also parallel to the surface 16 of the substrate 2 (not shown, extending into the plane of the paper) of the outer well 4, the semiconductor device 200 in accordance with various embodiments may only occupy an area of the substrate 202 determined by a length L1 extending parallel to a surface 216 of a substrate 202 (see FIG. 2, where L1 is shown to extend in left-right-direction) and an orthogonal width W1 also parallel to the surface 216 of the substrate 202 (not shown, extending into the plane of the paper) of the inner N-well 206.

In various embodiments, a capacitance of the semiconductor device may be reduced by less than a percentage comparable to the decrease in area. Thus, the capacity density of the semiconductor device may be increased. In other words, due to the smaller contribution of the well to the total area of the semiconductor device, using the same area, the semiconductor device in accordance with various embodiments may store more electric charge than the semiconductor device with the triple well design.

In various embodiments, the dynamic behavior of the semiconductor device may be improved by a factor of three to four through a replacement of the P-well, for example an HV-P-well (with a typical sheet resistance of $R_s \approx 6000\text{-}8000$ Ω/sq) by the N-well, for example an HV-N-well (with a typical sheet resistance of $R_s \approx 1800$ Ω/sq).

Figure 2:
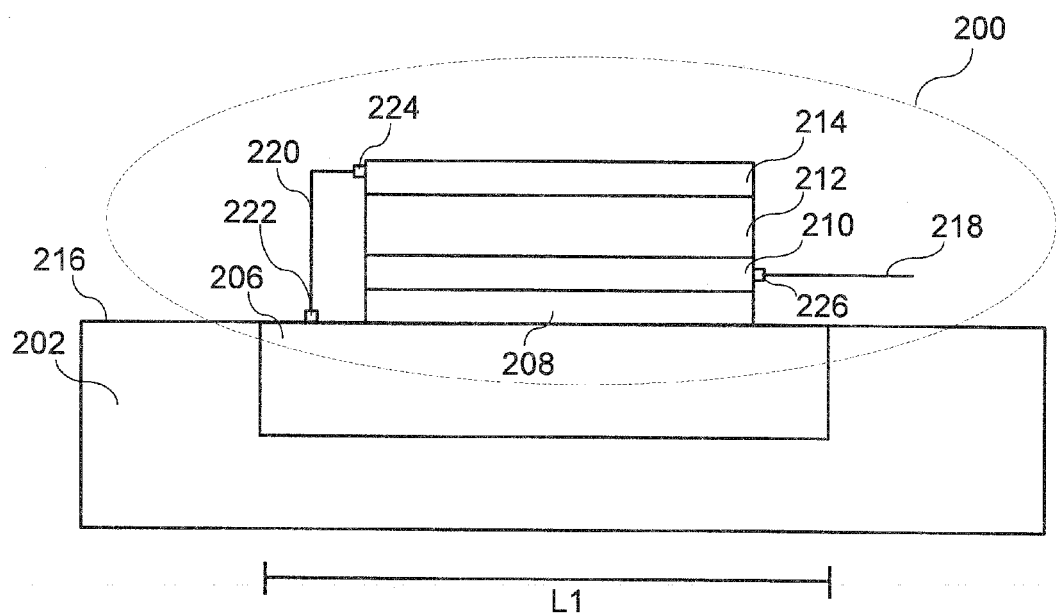
FIG. 2 shows a schematic cross section of a semiconductor device in accordance with various embodiments.

FIG. 2 shows a schematic cross section of a semiconductor device 200 in accordance with various embodiments.

In various embodiments, the semiconductor device 200 may include a well 206 of a first conductivity tpe. The first conductivity type may be N-type, and the well 206 may be referred to as an N-well 206. The N-well 206 may be an n-doped region 206 arranged in a substrate of a second conductivity type. The second conductivity type may be p-type. Thus, the substrate may be a p-doped substrate 202.

In various embodiments, the substrate 202 may be or include a semiconductor, for example silicon. The substrate may be p-doped. In various embodiments, the substrate may be p-doped with a doping concentration in a range from about $5 \times 10^{16}$ cm$^{-3}$ to about $10^{18}$ cm$^{-3}$, for example from about $10^{17}$ cm$^{-3}$ to about $5 \times 10^{17}$ cm$^{-3}$. If the substrate 202 is a silicon substrate 202, boron may for example be used for the p-doping.

The N-well 206 may be arranged in the substrate 202. By way of example, the N-well 206 may be formed in the p-doped substrate 202. In various embodiments, the N-well may be n-doped with a doping concentration in a range from about $5 \times 10^{16}$ cm$^{-3}$ to about $10^{18}$ cm$^{-3}$, for example from about $10^{17}$ cm$^{-3}$ to about $5 \times 10^{17}$ cm$^{-3}$. If the substrate 202 is a silicon substrate 202, phosphorus may for example be used for the n-doping.

The N-well 206 may extend to a first surface 216 of the substrate 202, for example to a first main surface 216 of the substrate 202. The N-well 206 may have an area determined by a length L1 along one dimension and a width W1 (not shown) along an orthogonal dimension of the surface 216 of the substrate 202. The N-well 206 may form a common continuous surface with the substrate 202 on the first surface 216 of the substrate. The area of the N-well 206 extending along the surface 216 of the substrate may be considered as a surface of the N-well 206.

In various embodiments, the N-well 206 may for example have a thickness in a range from about 50 nm to about 1 μm, for example from about 100 nm to about 500 nm.

In various embodiments, the length and the width of the N-well 206 may be in a range from about 1 μm to about 100 μm, for example from about 3 μm to about 20 μm, for example from about 10 μm to about 15 μm.

In various embodiments, the semiconductor device 200 may include an N-well terminal 222. The N-well terminal 222 may be electrically coupled to the N-well 206.

In various embodiments, a dielectric layer 208 may be arranged over the N-well 206 where the N-well 206 extends to the surface 216 of the substrate 202. The dielectric layer may for example be deposited, for example by means of chemical vapor deposition (CVD). The dielectric layer 208 may, in various embodiments, include or consist essentially of dielectric material. The dielectric layer 208 may for example include or consist essentially of an oxide, for example silicon dioxide, titanium dioxide or alumina. The dielectric layer 208 may include one or more layers, wherein multiple layers may include the same material or different materials.

In various embodiments, the dielectric layer 208 may have a thickness in a range from about 1 nm to about 50 nm, for example from about 2 nm to about 20 nm, for example from about 3 nm to about 8 nm. In various embodiments, the thickness of the dielectric layer 208 may be thin enough to allow tunneling of (hot) electrons through the dielectric layer 208. The dielectric layer 208 may therefore also be referred to as "tunnel oxide" or "tunneling layer".

In various embodiments, the dielectric layer 208 may be arranged over the N-well 206 in such a way that the dielectric layer 208 covers the surface of the N-well 206 only partially. Alternatively, the dielectric layer 208 may completely cover the surface of the N-well 206, exept for contact regions where the dielectric layer 208 may not be formed or may be removed in order to allow for an electrical contacting of the N-well 206 and/or of source- and/or drain regions (not shown) that may be formed in the N-well 206 and which may extend to the surface of the N-well 206.

In various embodiments, the dielectric layer 208 may be arranged directly on the N-well 206. In other embodiments, the dielectric layer 208 may be arranged indirectly on the N-well 206, in general over the N-well 206. By way of example, one or more intermediate layers may be formed between the N-well 206 and the dielectric layer 208.

In various embodiments, a layer 210 may be located over the dielectric layer 208. The layer 210 may be referred to as "floating gate". The layer 210 may be or include any material capable of storing an electric charge. The layer 210 may for example be or include a conductive or a semiconductive layer. In various embodiments, the layer 210 may include silicon, for example polysilicon, and/or a metal.

The layer 210 may for example be formed by means of deposition, for example by means of CVD (chemical vapor deposition) or PVD (physical vapor deposition).

In various embodiments, the layer 210 may have a size, i.e. a length extending parallel to the surface 216 of the substrate 202 and a width orthogonal to the length and parallel to the surface 216 of the substrate 202, in other words, form an area, that is about the same as a size of the dielectric layer 208. A length and a width of the dielectric layer may extend in the same directions as the length and the width of the layer 210. In various embodiments, the layer 210 may have a length that is smaller than the length of the dielectric layer 208. In various embodiments, the layer 210 may have a width that is smaller than the width of the dielectric layer 208. In various embodiments, the layer 210 may have a length and a width that are smaller than the length and the width, respectively, of the dielectric layer 208.

In various embodiments, the layer 210 may be arranged directly on the dielectric layer 208. In other embodiments, the layer 210 may be arranged indirectly on the dielectric layer 208, in general over the dielectric layer 208. In other words, the floating gate 210 may be arranged directly or indirectly on the dielectric layer 208 (e.g. with one or more layer thereinbetween).

In various embodiments, the layer 210 may have a thickness in a range from about 1 nm to about 500 nm, for example from about 5 nm to about 100 nm.

In various embodiments, the semiconductor device 200 may include a floating gate terminal 226. The floating gate terminal 226 may be electrically coupled to the floating gate 210. In various embodiments, the floating gate 210 may be electrically connectable to an integrated circuit (for an example, see FIG. 4) by means of the floating gate terminal 226.

In various embodiments, a dielectric layer 212 may be arranged over the layer 210. The dielectric layer 212 may for example be deposited, for example by means of chemical vapor deposition (CVD). The dielectric layer 212 may, in various embodiments, include or consist essentially of a dielectric material. The dielectric layer 212 may for example include or consist essentially of an oxide, for example silicon dioxide, titanium dioxide or alumina. The dielectric layer 212 may include one or more layers, wherein multiple layers may include the same material or different materials. In various embodiments, the dielectric layer 212 may include an oxide, for example silicon dioxide, on top of a nitride, for example silicon nitride, on top of another oxide, for example silicon dioxide. The dielectric layer 212 may therefore also be referred to as "ONO-layer" (oxide-nitride-oxide).

In various embodiments, the dielectric layer 212 may have a thickness in a range from about 1 nm to about 200 nm, for example from about 2 nm to about 100 nm, for example from about 5 nm to about 50 nm.

In various embodiments, the dielectric layer 212 may be arranged directly on the floating gate 210. In various embodiments, the dielectric layer 212 may be arranged indirectly on the floating gate 210, thus in general over the floating gate 210, with one or more layers therebetween.

In various embodiments, a control gate 214 may be disposed over the dielectric layer 212. The control gate 214 may for example be or include a conductive or a semiconductive layer. In various embodiments, the control gate 214 may include silicon (e.g. doped or undoped), for example polysilicon (e.g. doped or undoped), and/or a metal.

The control gate 214 may for example be formed by means of deposition, for example by means of CVD or PVD.

In various embodiments, the control gate 214 may be arranged directly on the dielectric layer 212. In other embodiments, the control gate 214 may be arranged indirectly on the dielectric layer 212. In general, the control gate 214 may be disposed over the dielectric layer 212. In other words, the control gate 214 may be arranged directly or indirectly on the dielectric layer 212.

In various embodiments, the control gate 214 may have a thickness in the range from about 1 nm to about 500 nm, for example in the range from about 5 nm to about 100 nm.

In various embodiments, the semiconductor device 200 may include a control gate terminal 224. The control gate terminal 224 may be electrically coupled to the control gate 214.

In various embodiments, the semiconductor device 200 may include an electrical connection 218. The electrical connection 218 may be electrically connected to the floating gate terminal 226. In various embodiments, the floating gate 210 may be electrically connectable to an integrated circuit (for an example, see FIG. 4) by means of the electrical connection 218 and the floating gate terminal 226.

In various embodiments, the semiconductor device 200 may include a switch 326. The floating gate 210 may be connectable to and disconnectable from the integrated circuit by means of the switch 326.

In various embodiments, the floating gate terminal 226 may be configured to receive a first voltage V1. In other words, the floating gate 210 may be at a first voltage V1. The first voltage V1 may be applied to the floating gate 210 by means of the floating gate terminal 226. In various embodiments, a charging of the floating gate 210 may be performed by applying appropriate voltages to the floating gate terminal 226. In various embodiments, the first voltage V1 may be positive when the semiconductor device 200 is in a charged state. In various embodiments, the first voltage V1 may be positive when the floating gate 210 is in a charged state. In various embodiments, the first voltage V1 may be negative when the semiconductor device 200 is in a charged state. In various embodiments, the first voltage V1 may be negative when the floating gate 210 is in a charged state. In other words, in various embodiments, the first voltage V1 may be a positive or negative first voltage V1. An absolute value of the first voltage V1 may for example be in a range from above 0 V to about 3 V, for short times even up to 4.2 V, for example in a range from 2 V to 3 V, for example around 2.5 V or for example around 3.5 V.

In various embodiments, the N-well 206 may be configured to conduct an electric current between the source region and the drain region when the semiconductor device 200 is in the charged state. In various embodiments, the N-well 206 may be configured to conduct an electric current between the source region and the drain region when the semiconductor device 200 is not in the charged state.

In various embodiments, the N-well 206, the dielectric layer 208 and the floating gate 210 may be considered as forming a P-type transistor. The transistor may be in a so-called inversion state, wherein the N-well 206 is configured to conduct the electric current when the first voltage V1 is negative and the absolute value of the first voltage V1 is higher than a threshold voltage.

In various embodiments, the P-type transistor may be in a so-called accumulation state, wherein the N-well 206 is configured to not conduct the electric current when the first voltage V1 is positive.

In various embodiments, an implant may be implanted into the N-well, wherein the implant may be configured to lower the threshold voltage. The implant may be configured to lower the absolute value of the threshold voltage. The implant may for example be implanted by means of ion implantation, for example by means of boron ion implantation.

In various embodiments, the semiconductor device 200 may include an electrical connection 220 electrically connecting the control gate terminal 224 with the N-well terminal 222. Hence, the control gate terminal 224 may be electrically connected with the N-well terminal 222. By means of the electrical connection 220, the control gate terminal 224 and the N-well terminal 222 may further be electrically connectable to the integrated circuit that the floating gate terminal 226 is connectable to (see for example FIG. 4). The electrical connection 220 may for example provide a ground connection of the integrated circuit, for example of a circuit 300 for a chip card.

The electrical connections 218, 220 may be formed by any suitable electrically conductive device and method of forming the same. They may for example be formed by means of vias and/or portions of metallization layers, wires, and the like.

The control gate 214 and the N-well 206 may be connectable to and disconnectable from the integrated circuit by means of the switch 326.

In various embodiments, the control gate terminal 224 and the N-well terminal 222 may be configured to receive a second voltage V2. Thus, in various embodiments, the control gate 214 and the N-well 206, which may be electrically connected, may be configured to be at a second voltage V2. In other words, the control gate 214 and the N-well 206 may be at a second potential. In various embodiments, the control gate terminal 224 and the N-well terminal 222 may be configured to receive the second voltage V2 when the semiconductor device 200 is in the charged state. The control gate terminal 224 and the N-well terminal 222 may for example receive the second voltage V2 by means of a ground connection. In other words, the second voltage V2 received by the control gate terminal 224 and by the N-well terminal 222 may be 0 V. In various other embodiments, the second voltage V2 received by both, the control gate terminal 224 and the N-well terminal 222, may be different from ground. In various embodiments, the second voltage V2 may be different from the first voltage V1. In various embodiments, the second voltage V2 may be different from the first voltage V1 when the semiconductor device 200 is in a charged state.

Figure 3:
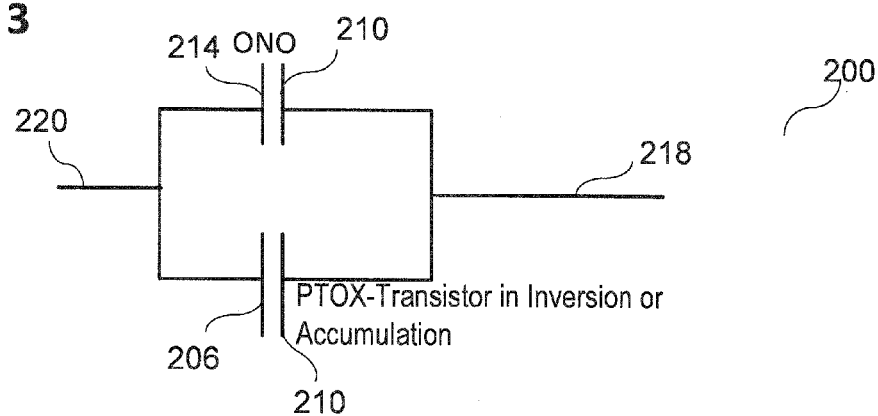
FIG. 3 shows a schematic circuit of a semiconductor device in accordance with various embodiments.
Figure 4:
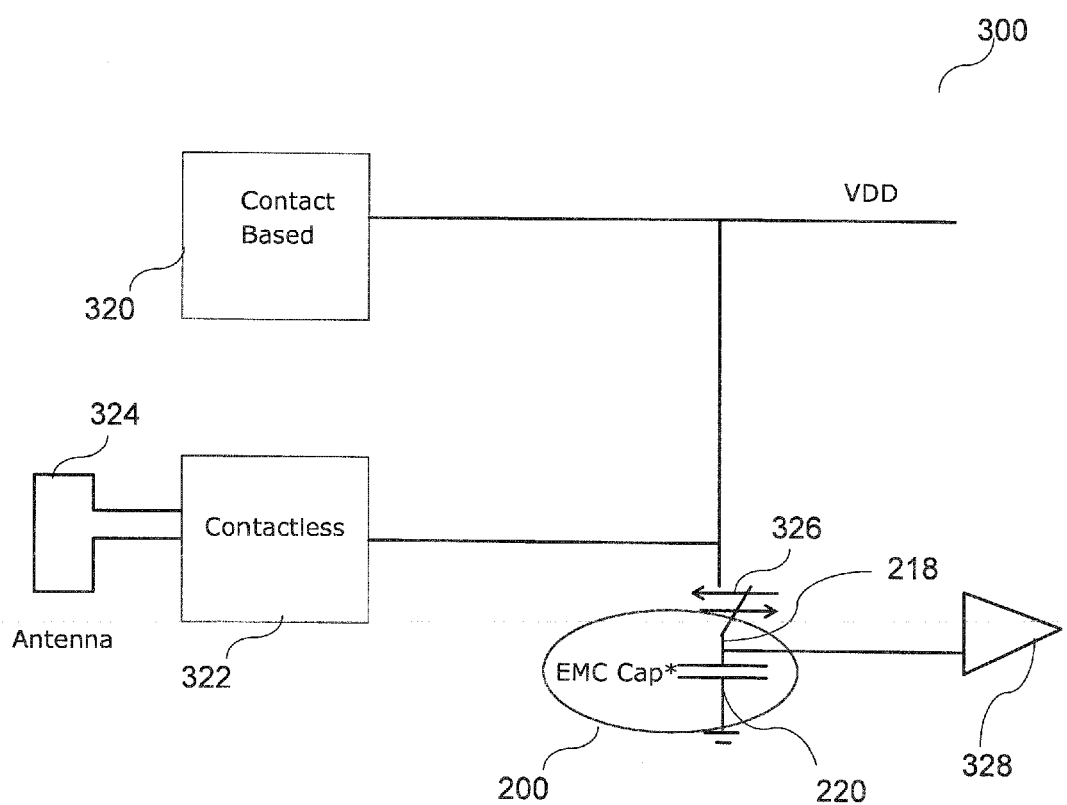
FIG. 4 shows a schematic circuit of a chip for a chip card.

As shown in FIG. 4, a semiconductur device in accordance with various embodiments, for example the semiconductor device 200 as shown in FIG. 2 and FIG. 3, may be included in an integrated circuit. The semiconductor device 200 may for example be included in a circuit 300 of a chip, for example in a chip for a chip card. As shown in FIG. 4 in a schematic view of the circuit 300, the chip card may include a device 320 for a contact-based interaction with an environment, and a device 322 and an antenna 324 for a contactless interaction with the environment. In the circuit 300, a supply voltage $V_{DD}$ may be provided. In various embodiments, the supply voltage may for example be generated in the chip card, for example in the antenna 324, by means of a magnetic field to which the chip card may be exposed. In various other embodiments, the supply voltage $V_{DD}$ may be provided through contacts of the device 320 for the contact-based interaction.

In various embodiments, the circuit 300 may further include a comparator 328. The comparator 328 may be configured to compare the supply voltage $V_{DD}$ with a first voltage V1, and may be configured to trigger the switch 326 depending on a result of the comparison. In various embodiments, the comparator 328 may be configured to trigger the switch 326 if the result of the comparison fulfills a predetermined criterion. By way of example, the comparator 328 may be configured to trigger the switch 328 and thereby connect the electrical connection 218 and hence the floating gate terminal 226 and the floating gate 210 to the circuit 300 if a voltage difference between the supply voltage $V_{DD}$ and the first voltage V1 is within a predetermined range. In various embodiments, the floating gate 210 with the charge stored on it may be connected to the circuit 300 if the supply voltage $V_{DD}$ is lower than a voltage required for a proper functioning of the chip chard, for example during read or write processes. In other words, the first voltage V1 may be considered as an emergency voltage for the semiconductor device and/or for the circuit 300.

In various embodiments, as shown in FIG. 3, at least one capacitor may be formed by the semiconductor device 200. In various embodiments, a first capacitor may be formed by the N-well 206 and the floating gate 210. In other words, the first capacitor may be formed by the p-type transistor, wherein the p-type transistor may be in the inversion state if the first voltage V1 is negative, and the p-type transistor may be in the accumulation state if the first voltage V1 is positive. A second capacitor may be formed by the floating gate 210 and the control gate 214. A combination of the first capacitor and the second capacitor can be considered as forming a sandwich capacitor. A total capacitance of the sandwich capacitor may be the sum of a capacitance of the first capacitor and of a capacitance of the second capacitor.

The total capacitance of the sandwich capacitor in accordance with various embodiments may be reduced as compared to a capacitor with a triple well configuration, as for example shown in FIG. 1. The total capacitance may for example be reduced by about 22%.

An area required by the sandwich capacitor in accordance with various embodiments, in other words, the area of the first main surface 216 of the substrate 202 covered by the semiconductor device 200, which may correspond to the area covered by the N-well, may be smaller than an area required by the triple well capacitor 100, in other words, the area of the first main surface 16 of the substrate 2 covered by the semiconductor device 100, which may correspond to the area covered by the (outer) N-well. In various embodiments, the area required by the sandwich capacitor in accordance with various embodiments may for example be smaller than the area required by the triple well capacitor 100 by about 45%.

For a given capacitor, a ratio of its capacitance and the area it requires may be referred to as its capacitance density. In the sandwich capacitor in accordance with various embodiments, as compared to the capacitor with the triple well, the reduction in area may be larger than the reduction in capacitance, such that its capacitance density may be increased. In other words, the capacitor in accordance with various embodiments may have a larger capacitance density than a comparable triple well capacitor. In the comparable triple well capacitor, the floating gate may for example have the same size as in the sandwich capacitor in accordance with various embodiments. In various embodiments, the capacitance density may for example be increased by about 41%.

In various embodiments, the sandwich capacitor in accordance with various embodiments may be able to store more charge than the triple well capacitor covering the same area.

In various embodiments, the sandwich capacitor in accordance with various embodiments may require a smaller area than a triple well capacitor with the same capacitance.

In various embodiments, a semiconductor device is provided. The semiconductor device may include: a well of a first conductivity type located within a substrate of a second conductivity type; a well terminal electrically coupled to the well; a floating gate disposed over the well; a floating gate terminal electrically coupled to the floating gate; a control gate disposed over the floating gate and electrically coupled to the well; and a control gate terminal electrically coupled to the control gate; wherein the floating gate terminal is configured to receive a first voltage; and wherein the control gate terminal and the well terminal are configured to receive a second voltage.

In various embodiments, the well of the first conductivity type may be an N-well and the substrate of the second conductivity type may be a P-type substrate.

In various embodiments, the first voltage may be different from the second voltage when the semiconductor device is in a charged state.

In various embodiments, the first voltage may be a positive or negative voltage when the semiconductor device is in a charged state.

In various embodiments, the well may include a source region and a drain region.

In various embodiments, the well may be configured to conduct an electric current between the source region and the drain region when the semiconductor device is in a charged state.

In various embodiments, the semiconductor device may further include an implant in the well, wherein the implant may be configured to lower a threshold voltage of a transistor formed by the well, the floating gate and a dielectric layer located between the well and the floating gate.

In various embodiments, a method of forming a semiconductor device is provided. The method may include: forming a well of a first conductivity type within a substrate of a second conductivity type; electrically coupling a well terminal to the well; disposing a floating gate over the well; electrically coupling a floating gate terminal to the floating gate; disposing a control gate over the floating gate electrically coupling the control gate to the well; and electrically coupling a control gate terminal to the control gate; wherein the floating gate terminal is configured to receive a first voltage; wherein the control gate terminal and the well terminal are configured to receive a second voltage.

In various embodiments, the well of the first conductivity type may be an N-well and the substrate of the second conductivity type may be a P-type substrate.

In various embodiments, the first voltage may be different from the second voltage when the semiconductor device is in a charged state.

In various embodiments, the first voltage may be a positive or negative voltage when the semiconductor device is in a charged state.

In various embodiments, the well may include a source region and a drain region.

In various embodiments, the well may be configured to conduct an electric current between the source region and the drain region when the semiconductor device is in a charged state.

In various embodiments, the method may further include implanting an implant in the N-well, wherein the implant is configured to lower a threshold voltage of a transistor formed by the N-well, the floating gate and a dielectric layer located between the N-well and the floating gate.

In various embodiments, an integrated circuit is provided. The semiconductor device according to various embodiments may be included in the integrated circuit.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

Various aspects of the disclosure are provided for devices, and various aspects of the disclosure are provided for methods. It will be understood that basic properties of the devices also hold for the methods and vice versa. Therefore, for sake of brevity, duplicate description of such properties may be omitted.

What is claimed is:

1. A semiconductor device, comprising:
    a well of a first conductivity type located within a substrate of a second conductivity type;
    a well terminal electrically coupled to the well;
    a floating gate disposed over the well;
    a floating gate terminal electrically coupled to the floating gate;
    a control gate disposed over the floating gate; and
    a control gate terminal electrically coupled to the control gate;
    wherein the control gate terminal is electrically connected with the well terminal;
    wherein the floating gate terminal is configured to receive a first voltage;
    wherein the control gate terminal and the well terminal are configured to receive a second voltage;
    wherein the well comprises a source region and a drain region;
    wherein the well of the first conductivity type is an N-well and the substrate is a P-type substrate; and
    wherein the semiconductor device is configured to conduct an electric current in the well between the source region and the drain region when the floating gate is negatively charged by the first voltage.

2. The semiconductor device according to claim 1, wherein the first voltage is different from the second voltage when the semiconductor device is in a charged state.

3. The semiconductor device according to claim 1, further comprising:
    an implant in the well,
    wherein the implant is configured to lower a threshold voltage of a transistor formed by the well, the floating gate, and a dielectric layer located between the well and the floating gate.

4. The semiconductor device of claim 1,
    wherein the semiconductor device is configured to not conduct an electric current in the well between the source region and the drain region when the floating gate is positively charged by the first voltage.

5. A method of forming a semiconductor device, the method comprising:
    forming an N-well within a P-type substrate;
    electrically coupling a well terminal to the N-well;
    disposing a floating gate over the N-well;
    electrically coupling a floating gate terminal to the floating gate;
    disposing a control gate over the floating gate
    electrically connecting the control gate to the N-well; and
    electrically coupling a control gate terminal to the control gate;
    applying a first voltage to the floating gate terminal;
    applying a second voltage to the control gate terminal and the well terminal;
    wherein the N-well comprises a source region and a drain region; and
    wherein the semiconductor device is configured to conduct an electric current in the N-well between the source region and the drain region when the floating gate is negatively charged by the first voltage.

6. The method according to claim 5,
    wherein the first voltage is different from the second voltage when the semiconductor device is in a charged state.

7. The method according to claim 5, further comprising:
    implanting an implant in the N-well,
    wherein the implant is configured to lower a threshold voltage of a transistor formed by the N-well, the floating gate, and a dielectric layer located between the N-well and the floating gate.

8. The method of claim 5,
    wherein the semiconductor device is configured to not conduct an electric current in the N-well between the source region and the drain region when the floating gate is positively charged by the first voltage.

9. An integrated circuit, comprising
    a semiconductor device comprising
    a well of a first conductivity type located within a substrate of a second conductivity type;

a well terminal electrically coupled to the well;
a floating gate disposed over the well;
a floating gate terminal electrically coupled to the floating gate;
a control gate disposed over the floating gate; and
a control gate terminal electrically coupled to the control gate;
wherein the control gate terminal is electrically connected with the well terminal;
wherein the floating gate terminal is configured to receive a first voltage;
wherein the control gate terminal and the well terminal are configured to receive a second voltage;
wherein the well comprises a source region and a drain region;
wherein the well of the first conductivity type is an N-well and the substrate is a P-type substrate; and
wherein the semiconductor device is configured to conduct an electric current in the well between the source region and the drain region when the floating gate is negatively charged by the first voltage.

10. The integrated circuit of claim 9,
wherein the semiconductor device is configured to not conduct an electric current in the well between the source region and the drain region when the floating gate is positively charged by the first voltage.

* * * * *